(12) United States Patent
Wang

(10) Patent No.: US 6,677,608 B2
(45) Date of Patent: Jan. 13, 2004

(54) SEMICONDUCTOR DEVICE FOR DETECTING GATE DEFECTS

(75) Inventor: Ting-Sing Wang, Hsinchu Hsien (TW)

(73) Assignee: Promos Technologies Inc., Hsinchu (TW)

( * ) Notice: Subject to any disclaimer, the term of this patent is extended or adjusted under 35 U.S.C. 154(b) by 0 days.

(21) Appl. No.: 10/004,755

(22) Filed: Dec. 3, 2001

(65) Prior Publication Data

US 2003/0102474 A1 Jun. 5, 2003

(51) Int. Cl.$^7$ ................................................ H01L 29/12
(52) U.S. Cl. .................. 257/48; 257/153; 257/154; 257/356; 438/11; 438/14; 324/765; 324/769; 324/526
(58) Field of Search .................... 257/48, 153, 154, 257/356; 324/765, 769, 526; 438/11, 14

(56) References Cited

U.S. PATENT DOCUMENTS 5,418,389 A  *  5/1995  Watanabe .................. 257/295
5,889,410 A  *  3/1999  El-Kareh et al. ........... 324/769

* cited by examiner

Primary Examiner—Tom Thomas
Assistant Examiner—Junghwa Im
(74) Attorney, Agent, or Firm—Ladas & Parry

(57) ABSTRACT

The present invention provides a semiconductor device for detecting gate defects and the method of using the same to detect gate defects. The semiconductor device is comprised of a semiconductor substrate having an oxide layer on the top, a gate having spacers, formed on the oxide layer and surrounding the semiconductor substrate, wherein the gate is also patterned to divide the semiconductor substrate into two parts not electrically connected, and a conductive layer formed on the semiconductor outside the gate. In addition, the method for using the semiconductor device of the present invention to detect gate defects is comprised of applying a ground voltage and a set voltage respectively to two parts divided by the gate in the semiconductor device, and measuring current between the two parts.

7 Claims, 5 Drawing Sheets

SEMICONDUCTOR DEVICE FOR DETECTING GATE DEFECTS

BACKGROUND OF THE INVENTION

1. Field of the Invention

The present invention relates to a device for detecting defects, and more particularly to a semiconductor device for detecting gate defects.

2. Description of the Prior Art

In the continuous development for integrated circuits (IC) of higher density and chips of reduced size, alignment of various layers and isolation or connection of various elements are major issues. Therefore, various tests are usually conducted at specific stages to investigate the performance of process equipment and elements produced to ensure the equipment is well-tuned and to examine the product quality.

Following the development of reduced IC size and higher density, the tolerance for defects is reduced greatly. Therefore, defects must be reduced to increase the yield. Generally, the lower the defect density, the higher the yield.

At the moment, conventional detection for defects uses optical theory to measure parameters for defect, thickness of thin films etc. However, due to the limitation of optical equipment, resolution and accuracy for ultramicron process are not adequate. Therefore, such conventional detection methods are far from ideal.

SUMMARY OF THE INVENTION

The object of the present invention is to solve the above-mentioned problems by providing a semiconductor device for detecting gate defects by electrical measurement.

Another object of the present invention is to provide a method for fabricating a semiconductor device for detecting gate defects, which utilizes general and simple processes to form the semiconductor device.

Another object of the present invention is to provide a semiconductor device for detecting gate defects, wherein the semiconductor device has high sensitivity and fast detection efficiency to precisely detect defects in gates.

In addition, during the process of forming gates, which comprises deposition, photolithography, etching, cleaning etc, where the related devices used are CVD reactor, stepper, etcher, and wet sink, their operating condition can be tested using the semiconductor device of the present invention.

To achieve the above-mentioned objects, the present invention provides a semiconductor device for detecting gate defects, comprising: a semiconductor substrate having an oxide layer on the top; a gate having spacers formed on the oxide layer and surrounding the semiconductor substrate, wherein the gate is also patterned to divide the semiconductor substrate to two parts not electrically connected; and a conductive layer formed on the semiconductor outside the gate.

According to the present invention, the method for fabricating in-line detect device for self-aligned contact defects, comprises applying a ground voltage and a set voltage respectively to two parts divided by the gate in the semiconductor device as described above; and measuring current between the two parts.

The semiconductor device for detecting gate defects of the present invention is shown in FIG. 1, where 10 represents the gate, and 20 is the conductive layer. In order to is a the structure of the semiconductor device, FIG. 2 is a cross-section along line A–A' in FIG. 1. In FIG. 2, 50 represents the semiconductor substrate, 40 represents the oxide layer, 20 represents the conductive layer and 30 the spacers on other sides of the gate 10. FIG. 3 is a cross-section along line B–B' in FIG. 1. In the semiconductor device of the present invention, the gate surrounds the whole semiconductor substrate, and also divides the semiconductor substrate into two parts not electrically connected. Therefore, when defects in the gate cause shorts, a current will be detected by electrical measurement.

The pattern of the gate is not restricted, as long as it divides the substrate into two parts without electrical connection. FIG. 4 is as another example of the pattern of the gate. The gate is polysilicon or other conductive metal, such as tungsten.

According to the semiconductor device of the invention, the semiconductor is divided into two parts by the gate, hence, if defects occur in the gate, shorts also occur. Under this circumstance, by applying the two parts of the semiconductor substrate to the ground connection and a set voltage respectively, defects in the semiconductor substrate will be detected.

BRIEF DESCRIPTION OF THE DRAWINGS

The present invention will become more fully understood from the detailed description of the preferred embodiments given hereinbelow and the accompanying drawings, given by way of illustration only and thus not intended to be limitative of the present invention.

PREFERRED EMBODIMENTS

FIGS. 5a~5d are process diagrams of the fabrication of the semiconductor device according to an embodiment of the present invention.

Figure 1:
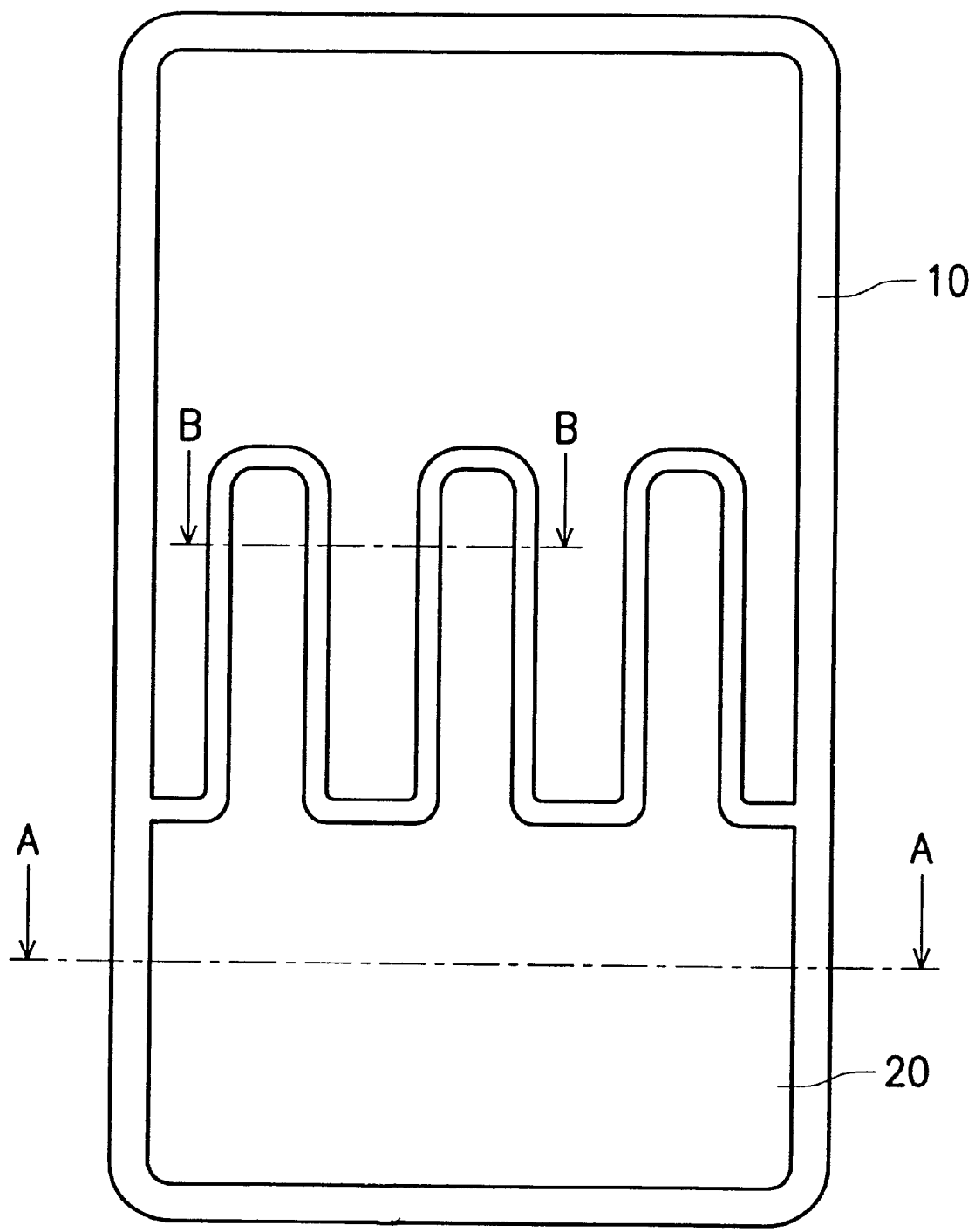
FIG. 1 is a top view of the semiconductor device of the present invention.
Figure 2:
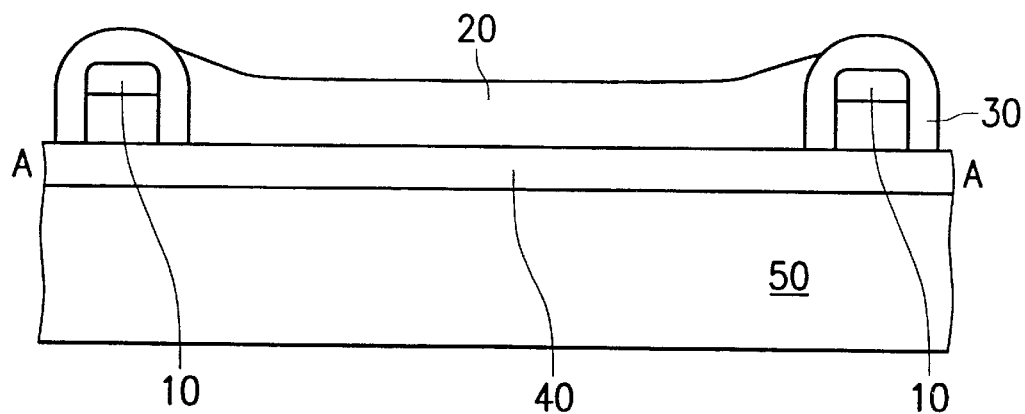
FIG. 2 is a schematic cross-section of the semiconductor device along the line A–A' in FIG. 1.
Figure 3:
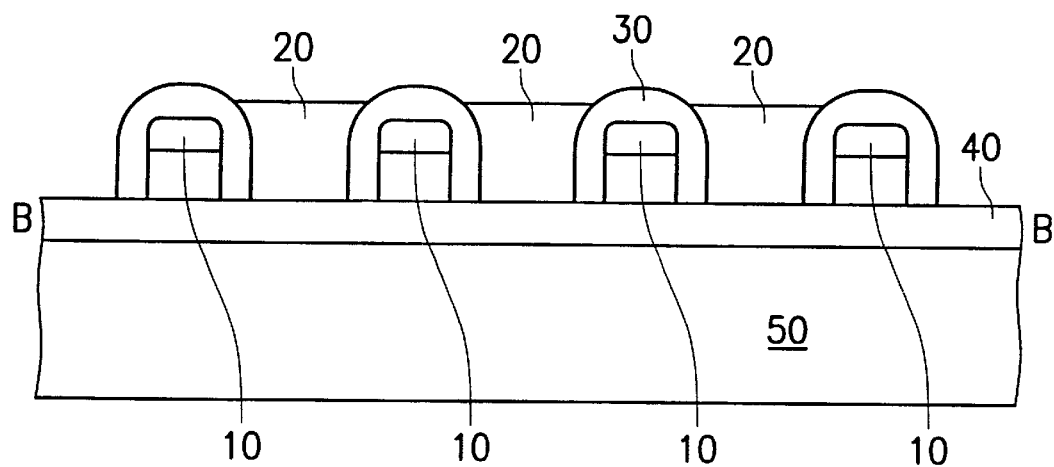
FIG. 3 is a schematic cross-section of the semiconductor device along the line B–B' in FIG. 1.
Figure 4:
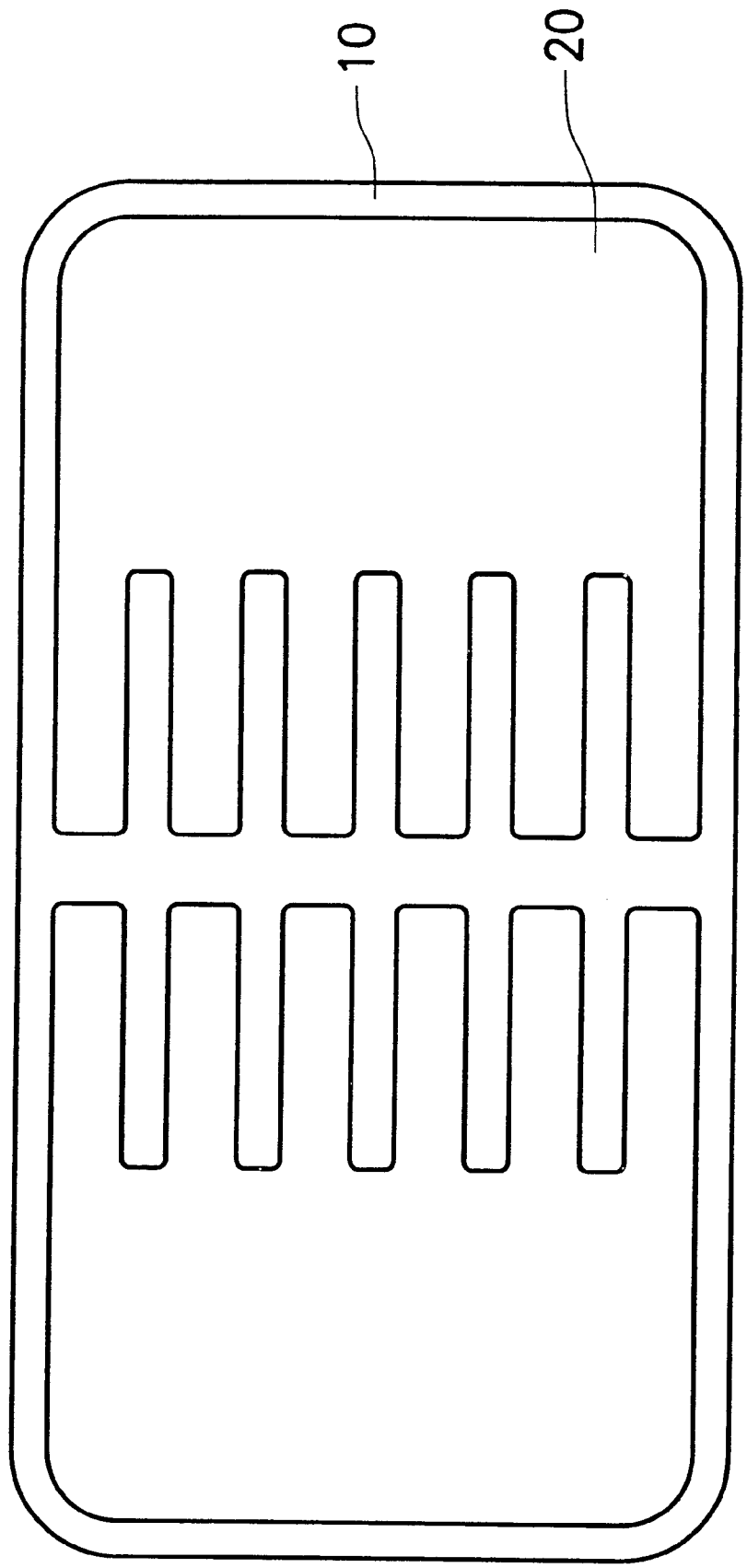
FIG. 4 shows another example of the pattern of the gate in the semiconductor device of the present invention.
Figure 5A:
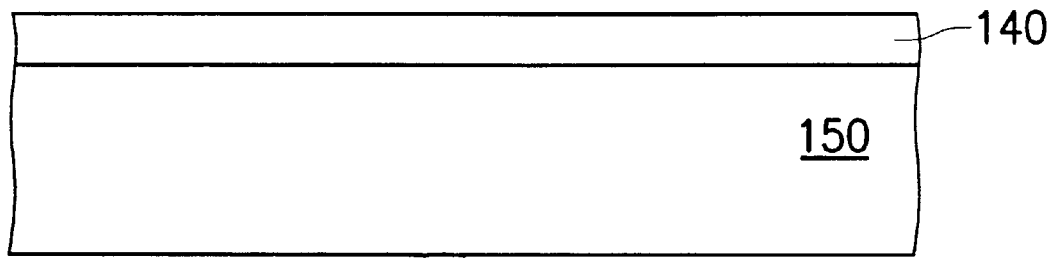
FIGS. 5a~5d are process diagrams according to an embodiment of the invention.
Figure 5B:
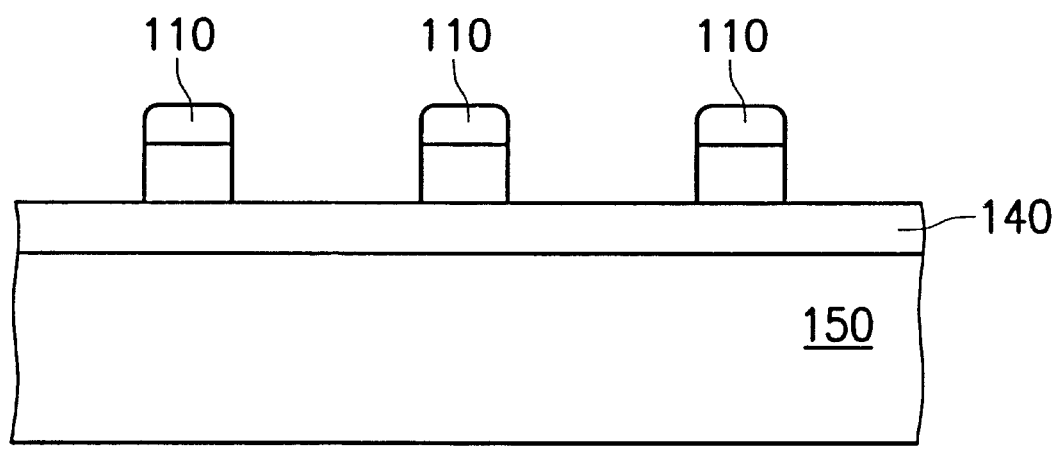

In FIG. 5a, a semiconductor substrate 150 having an oxide layer 140 is provided. Next, a gate 110 is formed on the oxide layer 140 and is patterned to divide the semiconductor substrate into two parts not connected electrically. Gate deposition is conducted in a CVD reactor. The material for the gate is not limited, general gate material is applicable. The gate is then patterned by a mask. At this time, a stepper is used, followed by an etcher. FIG. 5b is the top view of the above process.

Figure 5C:
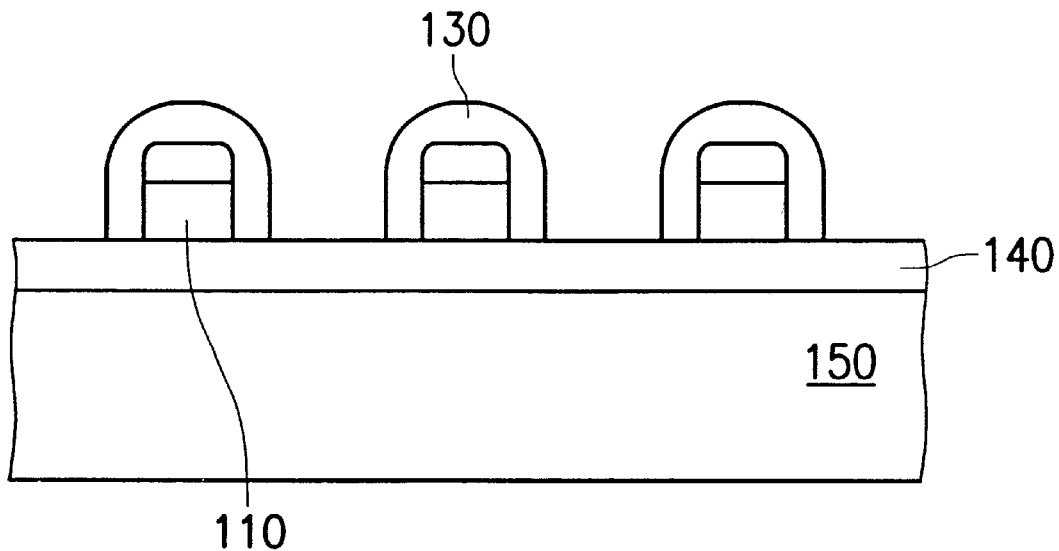

Next, dielectrical material is formed around the gate by conventional process, followed by back etching to form spacers 130 as shown in FIG. 5c. The process equipment involved in this step is the etcher and wet sink.

Figure 5D:
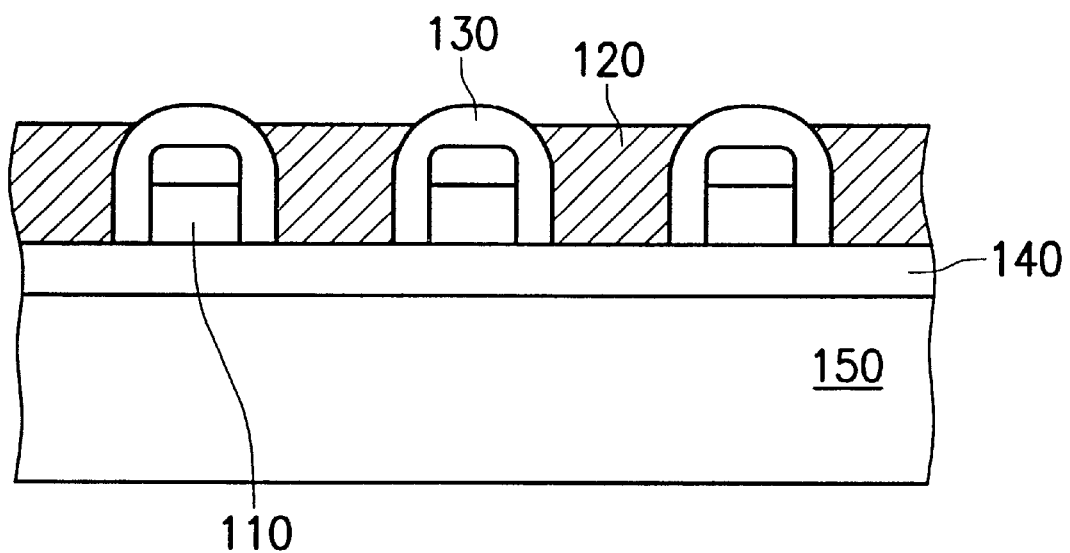

Finally, as shown in FIG. 5d, a conductive layer 120 is formed by CVD outside the area of the gate in the semiconductor substrate. The conductive layer 120 is conductive material, such as polysilicon or tungsten.

One of the two parts of the semiconductor device to be tested for gate defects as fabricated above is then grounded and a set voltage is applied to the other part for electrical measurement. If defects occur in the semiconductor device, a current will be observed.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A semiconductor device for detecting gate defects, comprising:
    a semiconductor substrate having an oxide layer
    a gate formed on the oxide layer, wherein the gate comprises a gate conductor stack and a spacer formed on top and sides of the gate conductor stack; and
    a conductive layer formed on the oxide layer and beside the gate, wherein the conductive layer is enclosed and divided into two parts not electrically connected, by the gate.

2. The device of claim 1, wherein the spacer is dielectric material.

3. The device of claim 1, wherein the spacer is silicon nitride.

4. The device of claim 1, wherein the conductive layer is polysilicon or tungsten.

5. A method for detecting gate defects, comprising:
    applying a ground voltage and a set voltage respectively to two parts of the conductive layer divided by the gate in a semiconductor device;
    measuring current between the two parts; and
    wherein the semiconductor device, comprises:
        a semiconductor substrate having an oxide layer thereon;
        a gate formed on the oxide layer, wherein the gate comprises a gate conductor stack and a spacer formed on top and sides of the gate conductor stack; and
        a conductor layer formed on the oxide layer and beside the gate, wherein the conductive layer is enclosed and divided into two parts not electrically connected, by the gate.

6. The device of claim 1, wherein the conductive layer is tungsten.

7. The method of claim 5, wherein the conductive layer is tungsten or polysilicon.

* * * * *